(12) United States Patent
Choi et al.

(10) Patent No.: US 6,922,098 B2
(45) Date of Patent: Jul. 26, 2005

(54) INTERNAL VOLTAGE GENERATING CIRCUIT

(75) Inventors: Jun Gi Choi, Ichon-Shi (KR); Chang Seok Kang, Ichon-Shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 0 days.

(21) Appl. No.: 10/737,359

(22) Filed: Dec. 16, 2003

(65) Prior Publication Data

US 2004/0257126 A1 Dec. 23, 2004

(30) Foreign Application Priority Data

Jun. 20, 2003 (KR) .................. 10-2003-0040091

(51) Int. Cl.[7] .................................................. G05F 1/10
(52) U.S. Cl. .................... 327/538; 327/541; 327/543
(58) Field of Search .............................. 327/530, 538, 327/540, 541, 543, 427, 581, 108, 544; 326/31, 33, 34; 365/189.09, 226

(56) References Cited

U.S. PATENT DOCUMENTS

| | | | | | |
|---|---|---|---|---|---|
| 5,373,477 | A | * | 12/1994 | Sugibayashi | 365/189.09 |
| 5,956,278 | A | * | 9/1999 | Itou | 365/189.09 |
| 6,717,460 | B2 | * | 4/2004 | Yamauchi et al. | 327/544 |
| 6,809,577 | B2 | * | 10/2004 | Matsumoto et al. | 327/541 |

* cited by examiner

*Primary Examiner*—Long Nguyen
(74) *Attorney, Agent, or Firm*—Marshall, Gerstein & Borun LLP

(57) ABSTRACT

The present invention relates to an active driver for generating an internal voltage. In an active operation of a semiconductor device, after a voltage drop of a core voltage (VCORE) by consumed current of the core voltage (VCORE) is detected in a multi-step, a corresponding transistor for a driver is variably operated depending on a detected voltage drop level. Therefore, in an active operation, an increase in an active consumption current depending on an increase in the size of an output driver can be minimized.

18 Claims, 5 Drawing Sheets

INTERNAL VOLTAGE GENERATING CIRCUIT

BACKGROUND

1. Field of the Invention

The present invention relates to an internal voltage generating circuit and, more specifically, to an internal voltage generating circuit that can minimize an increase of active consumption current depending on the size of a transistor for a driver used in an active operation.

2. Discussion of Related Art

Generally, as the level of integration in a dynamic random access memory (DRAM) is increased, a gate length and an oxide thickness of a transistor (for example, a metal oxide semiconductor field effect transistor (MOSFET) are reduced. As an external power supply voltage continues to use a high voltage (for example, 5V), however, a channel electric field becomes higher and reaches a voltage-resistant limit of the oxide film. Accordingly, the reliability of a transistor is degraded. In order to solve this problem, a voltage conversion circuit for lowering a power supply voltage within a chip has been actively adopted beginning 16M DRAM. Furthermore, as power consumption of a complementary metal-oxide-semiconductor (CMOS) circuit is proportional to a square of a voltage, there is an advantage that power consumption may be reduced if a low power supply voltage is used. In particular, if an internal voltage source is set to a static voltage, a stable power supply voltage can be secured even if the external power supply voltage is changed, resulting in stabilizing the operation of a chip.

Generally, variation in a load of peripheral circuits, memory arrays, etc., which receive an internal voltage (VINT), is very severe within a DRAM. It is thus difficult to design a circuit having a stabilized operation. For example, an internal voltage (VINT) that is used in a DRAM core, i.e., on the side of a cell and a sub word line driver, a sense amplifier, a X-decoder and a Y-decoder includes a core voltage (VCORE) and a high voltage (VPP) being an electrostatic potential voltage. For instance, if the external power supply voltage (VDD) becomes 2.5V, a core voltage (VCORE) becomes 1.8V. If the external power supply voltage (VDD) is 2.5V, the high voltage (VPP) becomes 3.5V to 3.9V. In an active operation of a DRAM, the core voltage (VCORE) is used. A large amount of current is consumed accordingly. Therefore, the core voltage (VCORE) is generated by an internal voltage generating circuit using an operational amplifier.

Figure 1:
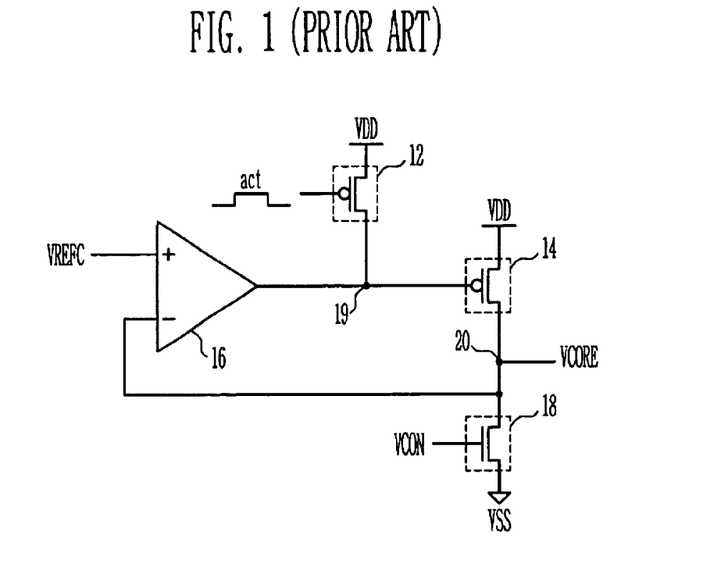
FIG. 1 is a circuit diagram illustrating the configuration of an internal voltage generating circuit in a related art.

FIG. 1 is a circuit diagram illustrating the configuration of a conventional internal voltage generating circuit;

Referring to FIG. 1, a conventional internal voltage generating circuit receives a reference voltage (VREFC) of about 1.8V to output a core voltage (VCORE) of 1.8V. In general, the internal voltage generating circuit consists of an operational amplifier 16, an output driver 14 and an n-channel MOSFET 18 (hereinafter, referred to as 'NMOS transistor'). The operational amplifier 16 has a non-inverse input terminal (+) to which a reference voltage (VREFC) is inputted and an inverse input terminal (−) to which an output voltage (VCORE) is inputted, and provides the output signal to a gate electrode of a p-channel MOSFET (hereinafter, referred to as 'PMOS transistor') of the output driver 14. The output driver 14 has a source electrode to which an external power supply voltage (VDD) is inputted and a drain electrode connected to an output terminal 20. The NMOS transistor 18 is operated by a control voltage (VCON; 0.8V), so that the potential of the output terminal 20 becomes a ground voltage (VSS). As a result, a core voltage (VCORE) that is dropped from the external power supply voltage (VDD) is outputted from the NMOS transistor 18.

This internal voltage generating circuit further includes a PMOS transistor 12 having a gate electrode to which an active signal (act) is inputted so that the driver operates only in an active operation. The PMOS transistor 12 has a source electrode to which the external power supply voltage (VDD) is inputted, and a drain electrode connected to the drive node 19. The PMOS transistor 12 is operated by the active signal (act). If the active signal (act) that is activated in an active operation is inputted as a Low state, the PMOS transistor 12 is turned on and the drive node 19 becomes a High state due to the external power supply voltage (VDD). The output driver 14 is thus turned off. Meanwhile, if the active signal (act) is shifted from a Low state to a High state, that is, when the DRAM is in an active operation, the output driver 14 is turned on.

The size of the output driver 14 is largely related to deviation in the core voltage (VCORE) outputted to the output terminal 20. In other words, according to the speed of current flowing into the output driver 14, a level of the core voltage (VCORE) is changed. For this reason, the size of the output driver 14 can be set by exactly predicting consumption current and loading capacitance of the core voltage (VCORE) that are obtained through simulations. Generally, the size of the PMOS transistor of the output driver 14 is set about 2 to 3 times higher than the results of simulations. There is a limit in increasing the size of the PMOS transistor of the output driver 14 due to several reasons. For this reason, the output driver 14 is usually constructed in several stages using a plurality of PMOS transistors as an option.

As described above, there is a limit in increasing the size of the output driver 14. For example, a level of the core voltage (VCORE) drops by current consumed in an active operation. After a given delay by a response speed of the internal voltage generating circuit, the PMOS transistor of the output driver 14 is operated. Thereafter, the level of the core voltage (VCORE) that drops by the operation of the PMOS transistor of the output driver 14 is forcibly boosted. At this time, if the size of the PMOS transistor of the output driver is large, it is over-damped higher than the core voltage (VCORE) level. Thus, lots of time is consumed until the voltage of the PMOS transistor is restored to an original core voltage (VCORE) level. Furthermore, if the size of the PMOS transistor of the output driver 14 is increased, a layout area of a circuit is also increased.

SUMMARY OF THE INVENTION

The present invention is contrived to solve various problems that may happen with regard to a driver for generating an internal voltage in a related art.

The present invention relates to minimizing an increase of an active consumption current depending on an increase in the size of an output driver in an active operation.

Furthermore, the present invention is concerned with minimizing the time taken to stabilize a voltage of a PMOS transistor in an output driver to a level of a core voltage (VCORE) when an over-damping condition happens, by minimizing the over-damping condition of the core voltage (VCORE) depending an increase in the size of the PMOS transistor.

In addition, the present invention is directed to minimizing an increase of a total layout area occupied by an internal voltage generating circuit, by minimizing an increase in the size of a PMOS transistor of an output driver in the internal voltage generating circuit using the PMOS transistor.

According to a preferred embodiment of the present invention, there is provided an internal voltage generating circuit, including an internal voltage-generating unit for converting an external power supply voltage into an internal voltage according to a reference voltage and outputting, and at least one internal voltage drop control unit that is operated by an enable signal generated by detecting a voltage level of the internal voltage, for stabilizing the internal voltage to a constant voltage level.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 2:
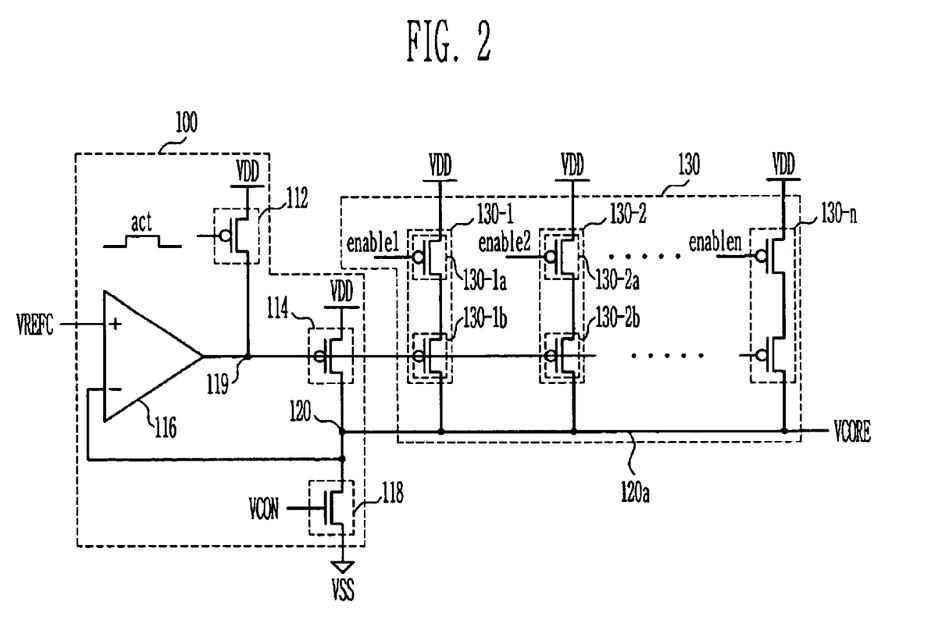
FIG. 2 is a circuit diagram illustrating the configuration of an internal voltage generating circuit according to a preferred embodiment of the present invention.

FIG. 2 is a circuit diagram illustrating the configuration of an internal voltage generating circuit according to a preferred embodiment of the present invention. It should be noted, however, that the internal voltage generating circuit according to the present invention is not limited to a full driver and a half driver can be used instead.

Referring to FIG. 2, the internal voltage generating circuit includes an internal voltage-generating unit 100 and an internal voltage drop control unit 130. The internal voltage-generating unit 100 has an operational amplifier 116 and an output driver 114, for converting an external power supply voltage (VDD) into an internal voltage according to a reference voltage (VREFC). The internal voltage-generating unit 100 further includes a ground control unit 118 for connecting the output terminal 120 to the ground voltage (VSS) and a device having a resistor, and an active operation unit 112.

The operational amplifier 116 has a non-inverse input terminal (+) to which the reference voltage (VREFC) is inputted and an inverse input terminal (−) to which an output voltage (VCORE) is inputted, and outputs its output to the output driver 114 and the internal voltage drop control unit 130.

The output driver 114 consists of a PMOS transistor. The PMOS transistor for the driver has a source electrode to which the external power supply voltage (VDD) is inputted and a drain electrode connected to the output terminal 120.

The internal voltage drop control unit 130 has an output voltage outputted to the output terminal 120 (for example, one or more sub internal voltage drop controllers 130-1 to 130-n (n is an integer) each of which is driven by a number of enable signals (enable1 to enable n), which are activated step by step (for example, a Low state) depending on the degree that the core voltage (VCORE) drops.

The sub internal voltage drop controllers 130-1 to 130-n are driven by the enable signals (enable1 to enable n), respectively, which are activated step by step when the core voltage (VCORE) is dropped from a target voltage level, thus boosting the core voltage (VCORE) being the output voltage. In this case, the number of the sub internal voltage drop controllers constituting the internal voltage drop control unit 130 may be adequately set in design. For simplicity, only the sub internal voltage drop controllers 130-1 and 130-2 shown in FIG. 2, of the plurality of the sub internal voltage drop controllers 130-1 to 130-n constituting the internal voltage drop control unit 130, will now be described.

The sub internal voltage drop controller 130-1 consists of a PMOS transistor for a switch 130-1a and a PMOS transistor for a driver 130-1b. The PMOS transistor for the switch 130-1a has a source electrode connected to an external power supply voltage source in order to receive the external power supply voltage (VDD), and a drain electrode connected to a source electrode of the PMOS transistor for the driver 130-1b. The PMOS transistor 130-1a is driven by the enable signal (enable1) inputted to its gate electrode. The PMOS transistor for the driver 130-1b has a source electrode connected to the drain electrode of the PMOS transistor for the switch 130-1a in order to receive the external power supply voltage (VDD) from the PMOS transistor for the switch 130-1a, and a drain electrode connected to an output line 120a electrically connected to the output terminal 120. The PMOS transistor 130-1b is driven by the output signal of the operational amplifier 116 inputted to its gate electrode.

The sub internal voltage drop control unit 130-2 consists of a PMOS transistor 130-2a for a switch and a PMOS transistor for a driver 130-2b. The PMOS transistor for the switch 130-2a has a source electrode connected to the external power supply voltage source in order to receive the external power supply voltage (VDD), and a drain electrode connected to a source electrode of the PMOS transistor for the driver 130-2b. The PMOS transistor 130-2a is driven by the enable signal (enable2) inputted to its gate electrode. The PMOS transistor for the driver 130-2b has a source electrode connected to the drain electrode of the PMOS transistor for the switch 130-2a in order to receive the external power supply voltage (VDD) from the PMOS transistor for the switch 130-2a, and a drain electrode connected to an output line 120a electrically connected to the output terminal 120. The PMOS transistor 130-2b is driven by the output signal of the operational amplifier 116 inputted to its gate electrode.

In the above, it is preferred that the total size of the PMOS transistor for the drivers each used in the output driver 114 and the sub voltage drop units 130-1 and 130-2 is same as that of the PMOS transistor for the driver used in a prior art. This is for the purpose of minimizing the area depending on an increase in the number of a PMOS transistor for a driver. In other words, assuming that the size of the PMOS transistor for the driver that is conventionally used is 100, the total size of the PMOS transistor for the drivers each used in the output driver 114 and the sub voltage drop unit 130-1 and 130-2 according to a preferred embodiment of the present invention is set to 100. In this case, the size of the PMOS transistor for the driver of the output driver 114 may be set to 50 and the size of the PMOS transistor for the driver used in the sub voltage drop units 130-1 and 130-2 may be set to 25, or the size of the PMOS transistor for the driver of the output driver 114 may be set to 70 and the size of the PMOS transistor for the driver used in the sub voltage drop units 130-1 and 130-2 may be set to 15. It is preferred that the size of the PMOS transistor for the driver is adequately set depending on the core voltage (VCORE) or set considering various operating conditions.

The ground control unit 118 functions to enable a voltage level of the core voltage (VCORE) to be stably generated, by forming a current path having resistance for the output terminal 120. Preferably, the ground control unit 118 consists of an NMOS transistor. In this case, the NMOS transistor is driven by the control voltage (VCON) and operates as a resistor device. For example, the ground control unit 118 may include a switching device such as a PMOS transistor instead of an NMOS transistor, or a resistor device.

It is preferable that the active operation unit 112 consists of a PMOS transistor in order to control the operation of the internal voltage generating circuit so that the circuit operates only in an active operation. In this case, the PMOS transistor is driven by the active signal (act) to transfer the power supply voltage (VDD) to the drive node 119. For example, the active operation unit 112 may consist of a switching device such as an NMOS transistor in place of a PMOS transistor. In its operation, if the active signal (act) is inputted as a Low state, the PMOS transistor is turned on and the external power supply voltage (VDD) is accordingly supplied to the drive node 119. The PMOS transistor of the output driver 114 is thus turned off. As a result, the internal voltage generating circuit does not operate.

The enable signal generating circuit unit 200 that generates the enable signals (enable1 and enable2) each inputted to the sub internal voltage drop controllers 130-1 and 130-2, will now be described. For simplicity, only the enable signal (enable1) will be described by way of an example.

Figure 3:
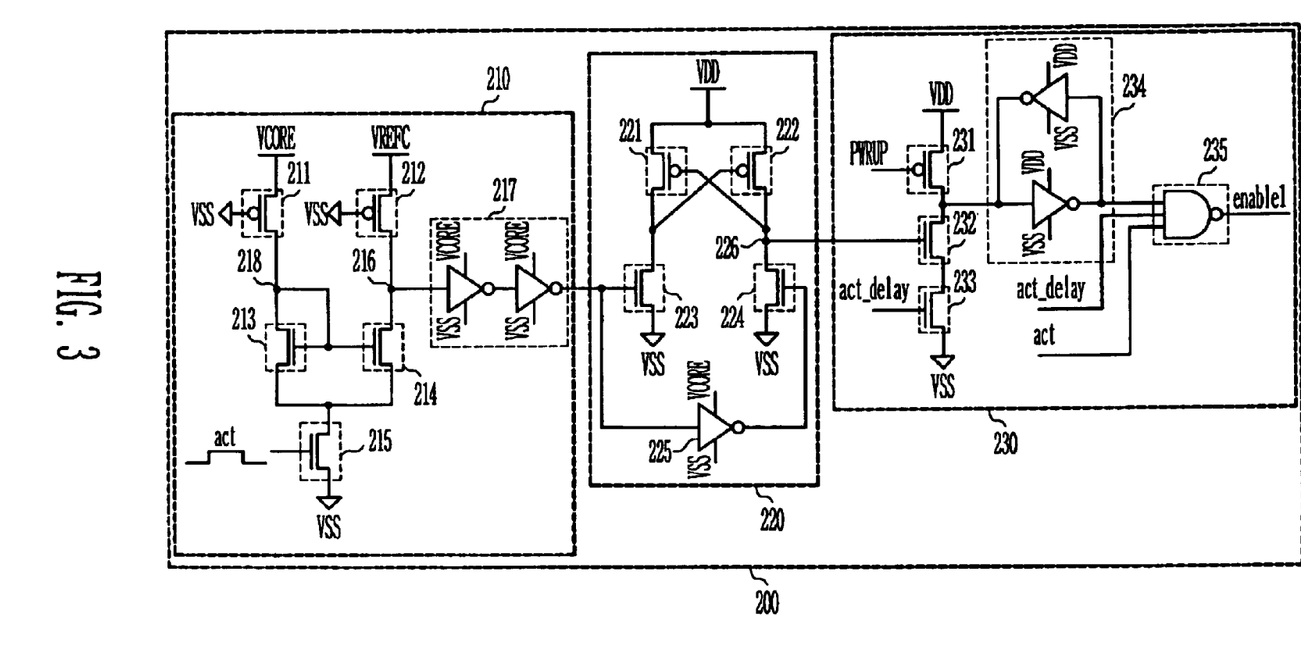
FIG. 3 is a detailed circuit diagram illustrating the configuration of an enable generating circuit unit for generating an enable signal (enable1 to enable n) shown in FIG. 2.

As shown in FIG. 3, the enable signal generating circuit unit 200 includes a detection unit 210, a voltage booster unit 220 and an output unit 230.

The detection unit 210 consists of a current mirror circuit in order to detect a voltage level of the core voltage (VCORE) on the basis of the reference voltage (VREFC). The detection unit 210 may further include a stabilization unit 217 for further stabilizing the output signal outputted to an output terminal 216. The detection unit 210 detects a core voltage (VCORE) when the core voltage (VCORE) drops to a predetermined voltage level.

Furthermore, the detection unit 210 detects a voltage level of the core voltage (VCORE) that drops to a given voltage level, wherein the value of a voltage level detected can be set in design. In other words, the value of a voltage level can be set by adjusting a width/length (hereinafter, referred to as W/L) of PMOS transistors 211 and 212, which operate as a resistor device by a ground voltage (VSS). For instance, in case where the core voltage (VCORE) drops from 1.8V to 1.5V, the W/L of the PMOS transistors 211 and 212 can be set as follows in order to detect the core voltage (VCORE) at that time. The W/L is designed so that the NMOS transistors 213 and 214 are not turned on below 1.0V. Further, if the PMOS transistors 211 and 212 are turned on by the ground voltage (VSS), the W/L is set so that the PMOS transistors 211 and 212 operate as a resistor device that causes a voltage drop of about 0.5V. As another example, in case where the core voltage (VCORE) drops from 1.8V to 1.3V, the W/L of the PMOS transistors 211 and 212 can be set as follows in order to detect the core voltage (VCORE) at that time. The W/L is designed so that the NMOS transistors 213 and 214 are not turned on below 1.0V. Further, if the PMOS transistors 211 and 212 are turned on by the ground voltage (VSS), the W/L is set so that the PMOS transistors 211 and 212 operate as a resistor device that causes a voltage drop of about 0.3V.

For example, in the event that the core voltage (VCORE) drops from 1.8V to 1.5V, the operation of the detection unit 210 that operates so that a voltage level of the core voltage (VCORE) is detected at this time will now be described. First, in a state where the NMOS transistor 215 is turned on by the active signal (act), if a core voltage (VCORE; 1.8V) is inputted to the source electrode of the PMOS transistor 211 and a reference voltage (VREFC; 1.8V) is inputted to the source electrode of the PMOS transistor 212, a voltage of 1.3V is transferred to the node 218 and the output terminal 216 through the respective PMOS transistors 211 and 212 that are turned on by the ground voltage (VSS). Accordingly, both the NMOS transistors 213 and 214 are turned on and an output signal having a level of the ground voltage (VSS) is thus outputted to the output terminal 216. In this state, if the core voltage (VCORE) drops to 1.5V, a voltage of 1.0V is transferred to the node 218. Therefore, the NMOS transistors 213 and 214 that keep turned on are turned off. As a result, an output signal having a voltage level of 1.3V is outputted to the output terminal 216. Meanwhile, the output signal having the voltage level of 1.3V is stabilized to a core voltage (VCORE) having a voltage level of 1.5V by means of the stabilization unit 217.

The voltage booster unit 220 has a level shifter for boosting the output signal outputted from the detection unit 210, i.e., the output signal corresponding to the core voltage (VCORE) to the power supply voltage (VDD). The operation of the voltage booster unit 220 will be described below. If the output signal of the detection unit 210 is inputted as a High state, i.e., a voltage level of the core voltage (VCORE), the NMOS transistor 223 is turned on and the NMOS transistor 224 is turned off. Accordingly, the PMOS transistor 222 is turned on and the power supply voltage (VDD) is transferred to the output terminal 226. On the contrary, if the output signal of the detection unit 210 is inputted as a Low state, i.e., a level of the ground voltage (VSS), the NMOS transistor 224 is turned on by a signal inverted through the inverter 225 and the PMOS transistor 221 is thus turned on. Accordingly, the PMOS transistor 222 is turned off and the potential of the output terminal 226 becomes the ground voltage (VSS).

The output unit 230 outputs the enable signal (enable1) in accordance with the output signal outputted from the voltage booster unit 220. The operation of the output unit 230 will be described below. In a state where a High signal of the power supply voltage (VDD) level is inputted to the NMOS transistor 232 from the voltage booster unit 220, if the active delay signal (act_delay) is inputted to the NMOS transistor 233 as a High state, a High signal of the ground voltage (VSS) level is outputted through the latch unit 234. Thereafter, the active signal (act) of a High state, the active delay signal (act_delay) and the output signal of the latch unit 234 are inputted to the logical combination unit 235. Accordingly, the enable signal (enable1) is outputted as a Low state. The output unit 230 further includes a PMOS transistor 231 for disabling the enable signal (enable1) to be a High state. The PMOS transistor 231 operates when the power-up signal (PWRUP) is inputted to its gate electrode as a Low state, thus transferring the power supply voltage (VDD) to a node (not shown). The enable signal (enable1) is accordingly outputted as a High state.

Figure 4:
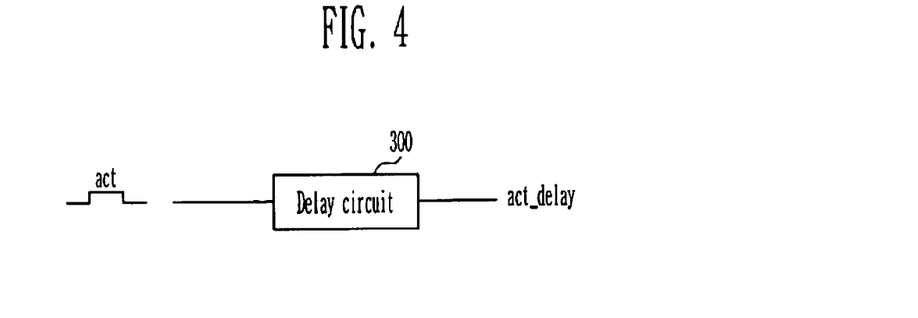
FIG. 4 is a block diagram illustrating the configuration of a delay circuit for delaying an active signal to output an active delay signal.

Meanwhile, the active delay signal (act_delay) that has been described regarding the output unit 230 is a signal of the active signal (act) that is delayed by a given time by the delay circuit 300, as shown in FIG. 4. The active delay signal (act_delay) serves to prevent the detection unit 210 from operating abnormally without comparing the core voltage (VCORE) with the reference voltage (VREFC), when the active signal (act) shifts from a Low state to a High state. Furthermore, the logical combination unit 235 consists of an NAND gate. The unit 235 prevents an abnormal output of the detection unit 210 from distorting the enable signal (enable1), when the active signal (act) shifts from a High state to a Low state.

The generating circuit unit 200 described above is not limited to the enable signal (enable1). In other words, the enable signal (enable2) may be generated by a circuit having the same configuration as the generating circuit unit 200. It is required, however, that a time point where the enable signal (enable1) and the enable signal (enable2) are enabled to a Low level according to a voltage level of the core voltage (VCORE) be different. To this end, for example, the W/L of the PMOS transistors 211 and 212 in the detection unit 210 may be adjusted. That is, if the core voltage (VCORE) drops from 1.8V to 1.5V, the enable signal (enable1) is enabled to a Low state. If the core voltage (VCORE) drops to 1.3V, the enable signal (enable2) is enabled to a Low state. For this purpose, the W/L of the PMOS transistors 211 and 212 is adequately set.

Operation examples of the internal voltage generating circuit according to preferred embodiments of the present invention will now be described with reference to Operation Example 1 and Operation Example 2 shown in FIG. 5. FIG. 6 is a graph indicating a simulation result of Operation Example 1 shown in FIG. 5, and FIG. 7 is a graph indicating a simulation result of Operation Example 2 shown in FIG. 5.

OPERATION EXAMPLE 1

Figure 5:
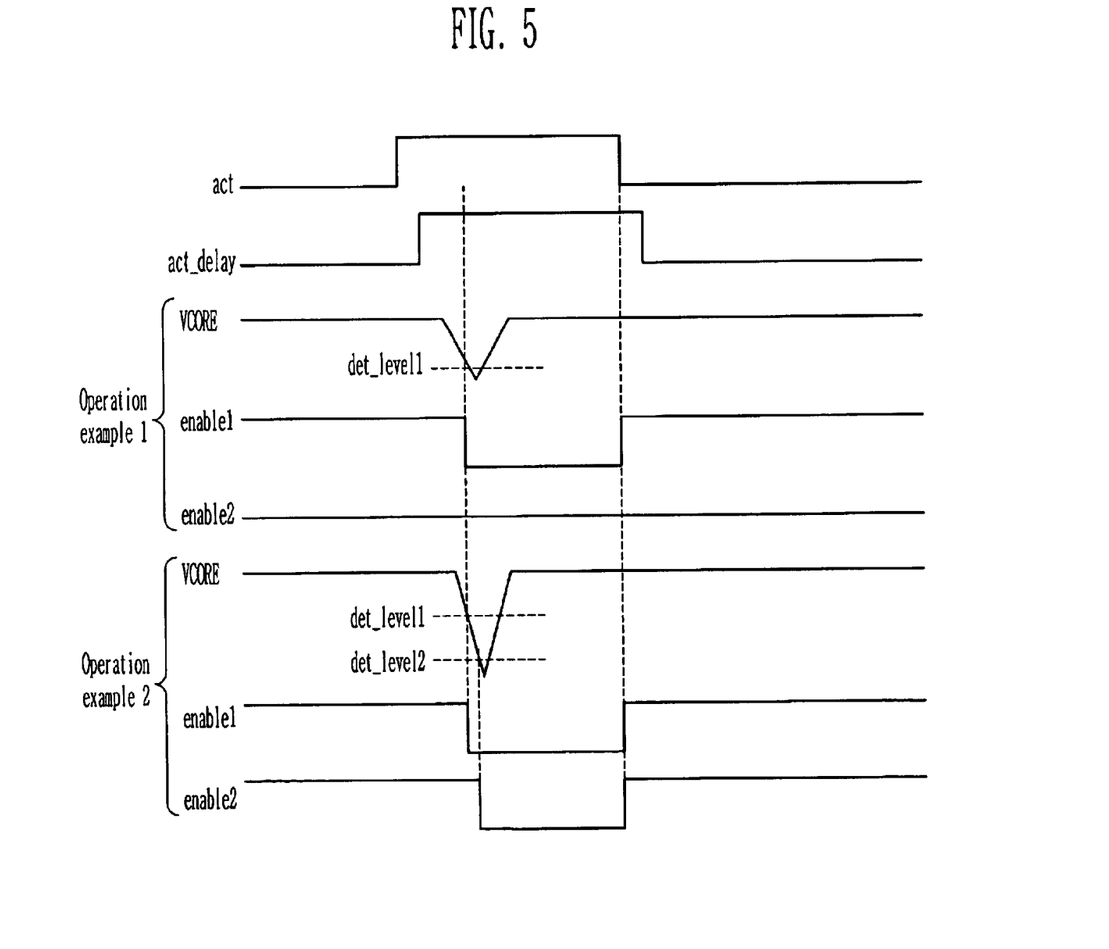
FIG. 5 is a waveform shown to explain the operation of the internal voltage generating circuit shown in FIG. 2.
Figure 6:
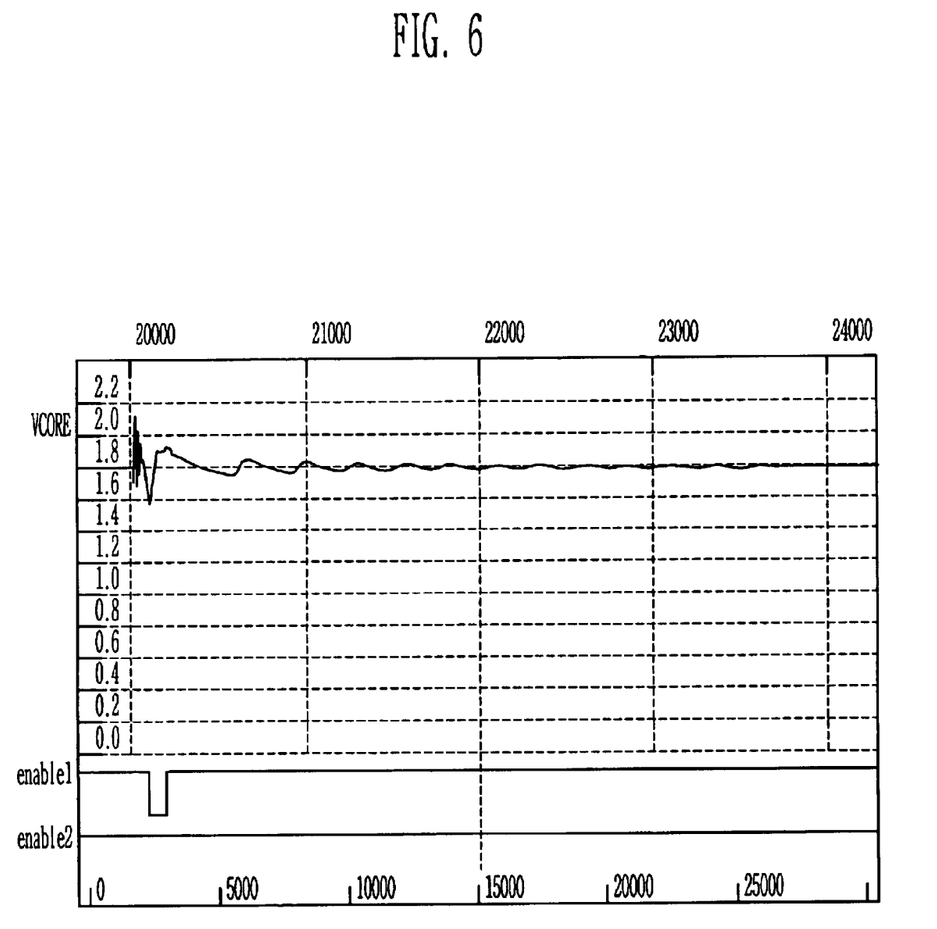
FIG. 6 is a graph indicating a simulation result of Operation Example 1 shown in FIG. 5.
Figure 7:
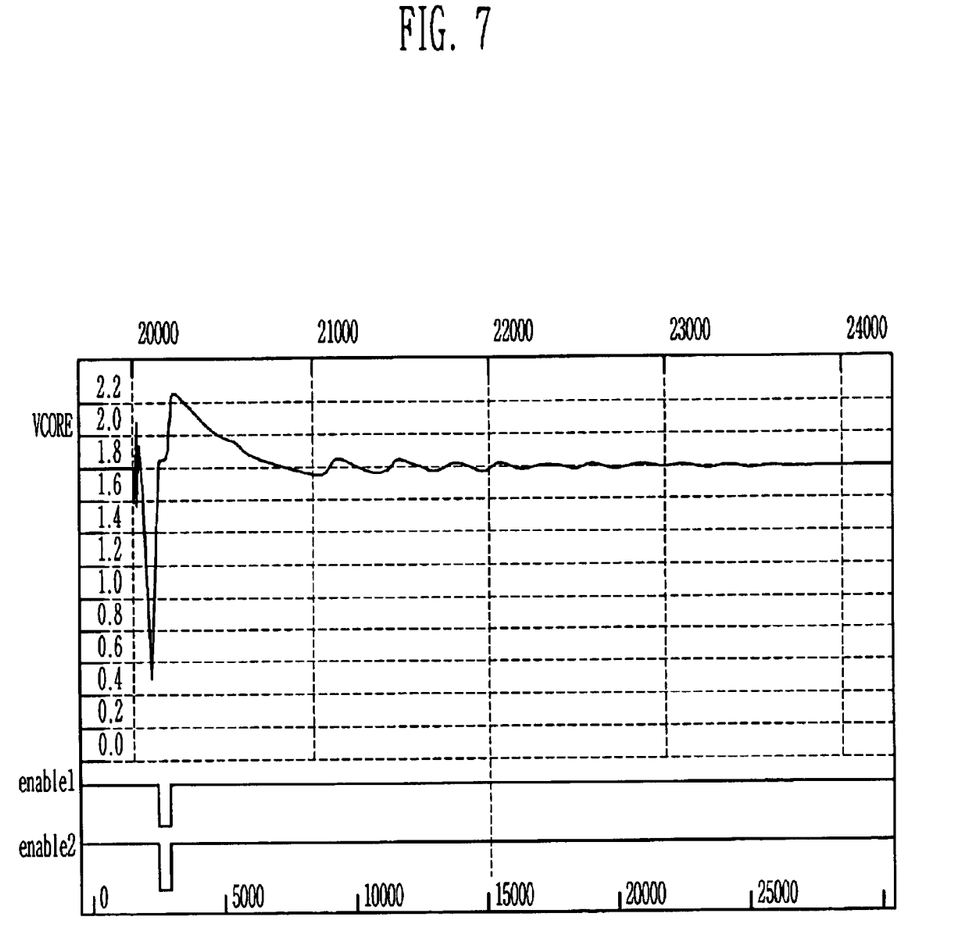
FIG. 7 is a graph indicating a simulation result of Operation Example 2 shown in FIG. 5.

Referring to FIG. 5 and FIG. 6, Operation Example 1 shows an example for describing a case where, if a core voltage (VCORE) drops to a first voltage level (det_level1), the core voltage (VCORE) that is dropped by a single enable signal (enable1) is boosted to an original voltage level.

In case where the core voltage (VCORE) drops to the first voltage level (det_level1), an enable signal (enable1) of a Low state is outputted through the enable signal generating circuit unit 200 (see FIG. 3), which is previously designed to detect the first voltage level (det_level1) and then output a signal corresponding to it. Thereafter, the PMOS transistor for the switch 130-1a of the sub internal voltage drop controller 130-1 (see FIG. 2) is turned on by the enable signal (enable1) of a Low state, so that a drive operation is performed. Accordingly, the potential of the output terminal 120 is boosted to a voltage level of its original core voltage (VCORE).

OPERATION EXAMPLE 2

Referring to FIG. 5 and FIG. 7, Operation Example 2 is an example for describing a case where, if a core voltage (VCORE) drops to a first voltage level (det_level1) and again drops to a second voltage level (det_level2), the dropped core voltage (VCORE) is boosted to an original voltage level by enabling the enable signals (enable1 and enable2) according to each voltage level.

In case where the core voltage (VCORE) drops to the first voltage level (det_level1), an enable signal (enable1) of a Low state is outputted through the enable signal generating circuit unit 200 (see FIG. 3), which is previously designed to detect the first voltage level (det_level1) and then output a signal corresponding to it. Thereafter, the PMOS transistor for the switch 130-1a of the sub internal voltage drop controller 130-1 (see FIG. 2) is turned on by the enable signal (enable1) of the Low state, so that a drive operation is performed. In view of a limit in a driving capability of the sub internal voltage drop controller 130-1 that is previously set, if the core voltage (VCORE) dropped to the first voltage level (det_level1) cannot be boosted, the core voltage (VCORE) drops from the first voltage level (det_level1) to the second voltage level (det_level2).

Thereafter, an enable signal (enable2) of a Low state is outputted through an enable signal generating circuit unit (not shown), which is previously designed to detect the second voltage level (det_level2) and then output a signal corresponding to it. Therefore, the PMOS transistor for the switch 130-2a of the sub internal voltage drop controller 130-2 (see FIG. 2) is turned on by the enable signal (enable2) of the Low state, so that a drive operation is performed. Resultantly, the potential of the output terminal 120 is boosted from the second voltage level (det_level2) to a voltage level of an original core voltage (VCORE).

As above, in case of Operation Example 1, only a single enable signal (enable1) of the enable signals (enable1 and enable2) is enabled to drive only the sub internal voltage drop controller 130-1. As in case of Operation Example 2, however, if the core voltage (VCORE) that drops to the first voltage level (det_level1) cannot be boosted to an original voltage level due to the limit in a driving capability of the sub internal voltage drop controller 130-1 that is previously set, voltage levels are detected in a multi-step and enable signals (enable1 and enable2) corresponding to them are then sequentially enabled, thus sequentially operating the sub internal voltage drop controllers 130-1 and 130-2. Accordingly, in case of Operation Example 1 (see FIG. 6), an over-damping condition is minimized compared to Operation Example 2 (see 7). Furthermore, the over-damping condition is more minimized in Operation Example 1 than in Operation Example 2 during the time taken to stabilize an output voltage to an original core voltage (VCORE).

Such a result is closely related to the size of the PMOS transistor for the driver used in an active operation, as described above. In case of Operation Example 1, only the PMOS transistor for the driver 130-1b of the sub internal voltage drop controller 130-1 operates. In case of Operation Example 2, however, both the PMOS transistor for the driver 130-1b of the sub internal voltage drop controller 130-1 and the PMOS transistor for the driver 130-2b of the sub internal voltage drop control unit 130-2 operate. Due to this, the total size of the PMOS transistor for the driver used in the active operation is increased compared to Operation Example 1. Therefore, in case of Operation Example 2, the over-damping condition takes place greatly and the time taken to stabilize an output voltage to the core voltage (VCORE) is increased, compared to Operation Example 1. In other words, the smaller the size of a PMOS transistor for a driver, the less the occurrence of the over-damping condition.

Meanwhile, in the present embodiments, the total size of all the PMOS transistors used as a driver is set to 100 and this size is distributed to respective PMOS transistors. That is, in a prior art, a single PMOS transistor is used for a driver. Thus, the size of the conventional PMOS transistor for the driver corresponds to the total size of a number of PMOS transistors for the driver according to an embodiment of the present invention. Accordingly, in a related art, a PMOS transistor for a driver operates unconditionally without regard to a voltage level of a core voltage (VCORE) in an active operation. In the internal voltage generating circuit according to the present invention, however, as a corresponding PMOS transistor for a driver is variably operated in accordance with the voltage level of the core voltage (VCORE), an over-damping condition and an operating consumption current can be reduced compared to a prior art.

According to the present invention described above, in an active operation of a semiconductor device, a voltage drop of a core voltage (VCORE) by consumed current of the core voltage (VCORE) is detected in a multi-step and a corresponding transistor for a driver is variably operated depending on a level of the voltage drop. Therefore, the present invention has an effect that it can minimize an increase in active consumption current depending on an increase in the size of an output driver in the active operation.

Furthermore, according to the present invention, an over-damping condition of a core voltage (VCORE) depending on an increase in the size of a PMOS transistor of an output driver is minimized. It is therefore possible to minimize the time taken to stabilize an output voltage to a level of the core voltage (VCORE) when an over-damping condition takes place.

In addition, according to the present invention, in an internal voltage generating circuit using a PMOS transistor of an output driver, an increase in the size of a PMOS transistor of an output driver is minimized. Therefore, a total layout area occupied by an internal voltage generating circuit can be minimized.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. An internal voltage generating circuit, comprising:
    an internal voltage-generating unit for converting an external power supply voltage into an internal voltage according to a reference voltage and outputting the internal voltage; and
    a plurality of internal voltage drop control units that are sequentially operated by enable signals which are sequentially generated according to the internal voltage, for stabilizing the internal voltage to a constant voltage level.

2. The internal voltage generating circuit as claimed in claim 1, wherein each of the plurality of internal voltage drop control units comprises:
    a switching unit operated by a respective enable signal of the enable signals; and
    a sub driver operated by a signal wherein the signal is also controlling the operation of an output driver of the internal voltage-generating unit, for receiving the power supply voltage transferred through the switching unit for stabilizing the internal voltage level to the constant voltage level.

3. The internal voltage generating circuit as claimed in claim 2, wherein the sub driver is a PMOS transistor.

4. The internal voltage generating circuit as claimed in claim 1, wherein the internal voltage-generating unit is controlled so that the internal voltage-generating unit is operated according to an active signal that is generated in an active operation.

5. The internal voltage generating circuit as claimed in claim 1, wherein the enable signals are generated by a plurality enable signal generating units, each of the plurality of enable signal generating units comprises:
    a detection unit for detecting the internal voltage according to the reference voltage;
    a voltage booster unit for boosting an output of the detection unit; and
    an output unit for outputting a respective enable signal of the enable signals depending on an output of the voltage booster unit.

6. The internal voltage generating circuit as claimed in claim 5, wherein the detection unit is a current mirror that operates according to an active signal.

7. The internal voltage generating circuit as claimed in claim 5, wherein the detection unit comprises:
    a current mirror that operates according to an active signal; and
    a stabilization unit for stabilizing an output of the current mirror and outputting the output of the detection unit.

8. The internal voltage generating circuit as claimed in claim 5, wherein the voltage booster unit is a level shifter.

9. The internal voltage generating circuit as claimed in claim 5, wherein the output unit comprises:
    a PMOS transistor serially connected between a power supply voltage source and a node and operated according to a power-up signal;
    a first NMOS transistor connected between the node and a ground voltage source, wherein the first NMOS transistor is turned on by the output of the voltage booster unit;
    a second NMOS transistor serially connected between the first NMOS transistor and the ground voltage source, wherein the second NMOS transistor is turned on by a delay signal of an active signal;
    a latch unit for latching the potential of the node and outputting an output signal of the latch unit; and
    a NAND gate for performing a NAND operating for the output signal of the latch unit, the active signal and the delay signal.

10. An internal voltage generating circuit, comprising:
    an internal voltage-generating unit for converting an external power supply voltage into an internal voltage according to a reference voltage and outputting the internal voltage;
    a plurality of enable signal generating units for detecting a voltage level of the internal voltage and sequentially generating enable signals; and
    a plurality of internal voltage drop control units that are sequentially operated by the enable signals, for stabilizing the internal voltage to a constant voltage level.

11. The internal voltage generating circuit as claimed in claim 10, wherein each of the plurality of internal voltage drop control units comprises:
    a switching unit operated by a respective enable signal of the enable signals; and
    a sub driver operated by a signal wherein the signal is also controlling the operation of an output driver of the internal voltage-generating unit, for receiving the power supply voltage transferred through the switching unit for stabilizing the internal voltage to the constant voltage level.

12. The internal voltage generating circuit as claimed in claim 11, wherein the sub driver is a PMOS transistor.

13. The internal voltage generating circuit as claimed in claim 10, wherein the internal voltage-generating unit is controlled so that the internal voltage-generating unit is operated according to an active signal that is generated in an active operation.

14. The internal voltage generating circuit as claimed in claim 10, wherein each of the plurality of enable signal generating units comprises, respectively:

a detection unit for detecting the internal voltage according to the reference voltage;

a voltage booster unit for boosting an output of the detection unit; and an output unit for outputting a respective enable signal of the enable signals depending on an output of the voltage booster unit.

15. The internal voltage generating circuit as claimed in claim 14, wherein the detection unit is a current mirror that operates according to an active signal.

16. The internal voltage generating circuit as claimed in claim 14, wherein the detection unit comprises:

a current mirror that operates according to an active signal; and a stabilization unit for stabilizing an output of the current mirror and outputting the output of the detection unit.

17. The internal voltage generating circuit as claimed in claim 14, wherein the voltage booster unit is a level shifter.

18. The internal voltage generating circuit as claimed in claim 14, wherein the output unit comprises:

a PMOS transistor serially connected between a power supply voltage source and a node and operated according to a power-up signal;

a first NMOS transistor connected between the node and a ground voltage source, wherein the first NMOS transistor is turned on by the output of the voltage booster unit;

a second NMOS transistor serially connected between the first NMOS transistor and the ground voltage source, wherein the second NMOS transistor is turned on by a delay signal of an active signal;

a latch unit for latching the potential of the node and outputting an output signal of the latch unit; and a NAND gate for performing a NAND operating for the output signal of the latch unit, the active signal and the delay signal.

* * * * *

UNITED STATES PATENT AND TRADEMARK OFFICE
CERTIFICATE OF CORRECTION

PATENT NO. : 6,922,098 B2
DATED : July 26, 2005
INVENTOR(S) : Jun G. Choi et al.

It is certified that error appears in the above-identified patent and that said Letters Patent is hereby corrected as shown below:

Title page,
Item [73], Assignee, "Kyungki-do" should be -- Kyungki-Do --.

Column 9,
Line 64, "the internal voltage level to" should be -- the internal voltage to --.

Signed and Sealed this

Sixth Day of June, 2006

JON W. DUDAS
*Director of the United States Patent and Trademark Office*